United States Patent [19]
Nogami et al.

[11] Patent Number: 4,853,897
[45] Date of Patent: Aug. 1, 1989

[54] COMPLEMENTARY SEMICONDUCTOR MEMORY DEVICE

[75] Inventors: Kazutaka Nogami, Kawasaki; Takayasu Sakurai, Tokyo, both of Japan

[73] Assignee: Kabushiki Kaisha Toshiba, Kawasaki, Japan

[21] Appl. No.: 128,946

[22] Filed: Dec. 4, 1987

[30] Foreign Application Priority Data

Dec. 10, 1986 [JP] Japan .................................. 61-293751
Mar. 19, 1987 [JP] Japan .................................. 62-65017

[51] Int. Cl.$^4$ .......................... G11C 11/40; G11C 7/00
[52] U.S. Cl. ............................... 365/189.11; 365/190; 365/206; 365/210
[58] Field of Search ............... 365/189, 190, 174, 210, 365/203-206

[56] References Cited

U.S. PATENT DOCUMENTS 4,399,519  8/1983  Masuda et al. .................. 365/189 X
4,472,792  9/1984  Shimohigashi et al. ............ 365/189

OTHER PUBLICATIONS

Suzuki et al., "A 128K Word×8 Bit Dynamic RAM," IEEE Journal of Solid-State Circuits, vol. SC-19, No. 5, pp. 624-627, Oct. 1984.
Taylor et al., "A 1 Mb CMOS DRAM with a Divided Bitline Matrix Architecture," IEEE International Solid-State Circuits Conference, ISSCC Digest of Technical Papers, pp. 242-243, Feb. 1985.
Mohsen et al., "The Design and Performance of CMOS 265K Bit DRAM Devices," IEEE Journal of Solid-State Circuits, vol. 19, No. 5, Oct. 1984.
Wang et al., "A 21 ns 38K×8 CMOS SRAM With a Selectively Pumped P-Well Array," IEEE International Solid-State Circuits Conference, ISSCC Digest of Technical Papers, pp. 254-255, Feb. 1987.

*Primary Examiner*—Stuart N. Hecker
*Assistant Examiner*—Alyssa H. Bowler
*Attorney, Agent, or Firm*—Finnegan, Henderson, Farabow, Garrett & Dunner

[57] ABSTRACT

The invention discloses a semiconductor memory device possessing high operational reliability. In the semiconductor memory device according to the invention, a plurality of well regions of a conductivity type different from that of a semiconductor substrate are formed in the semiconductor substrate, and a memory cell array and a bit line driver are formed in other well regions, situated away from each other. With this arrangement, the number of signal lines to be connected to the well region in which the memory cell array is formed can be reduced, and the adverse influence of minority carriers generated upon operation of the bit line driver can be prevented. With this arrangement, well bias can be applied only to memory cell array. As a result, the operational reliability of the semiconductor memory device can be improved.

10 Claims, 10 Drawing Sheets

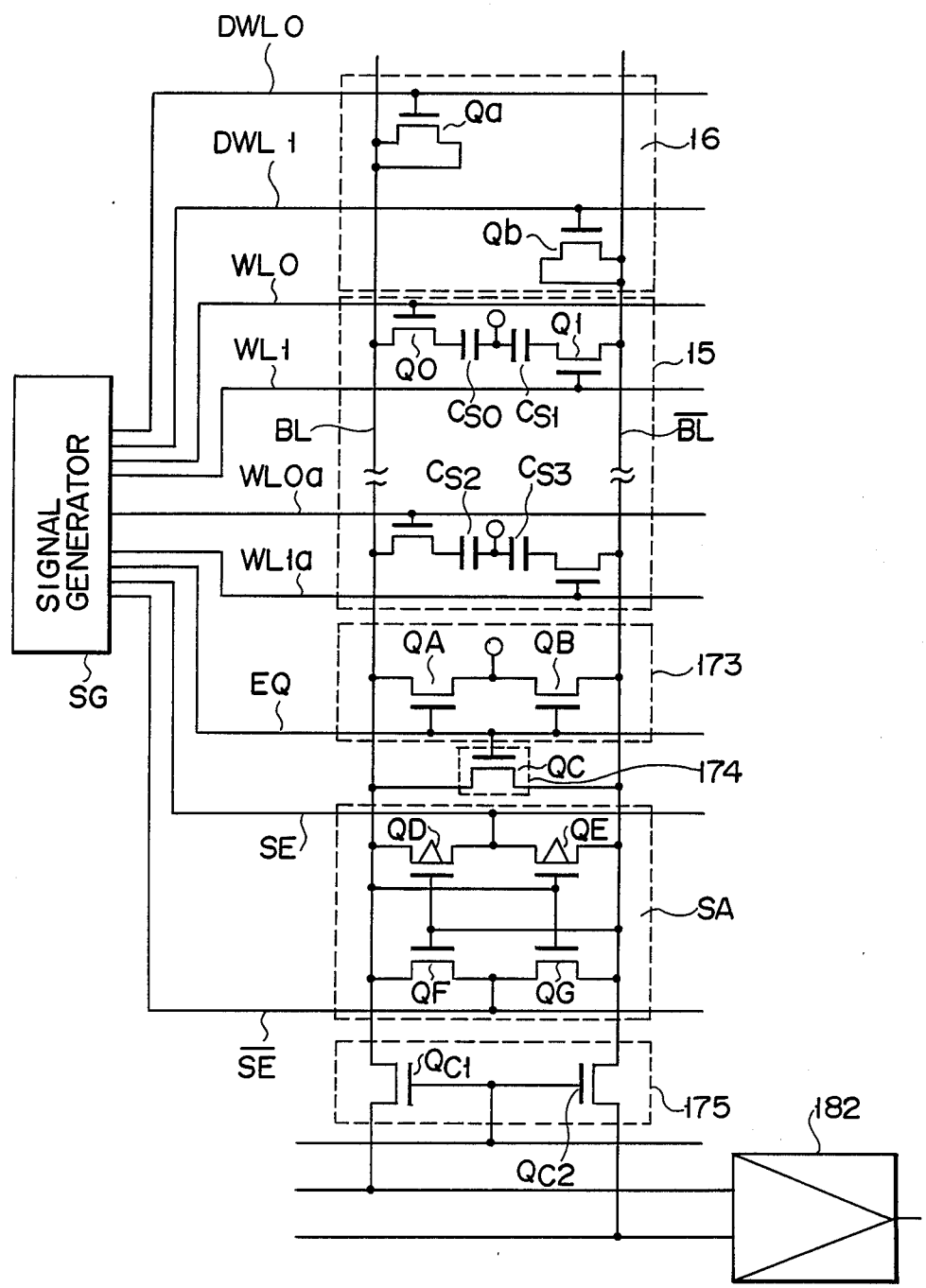
F I G. 6

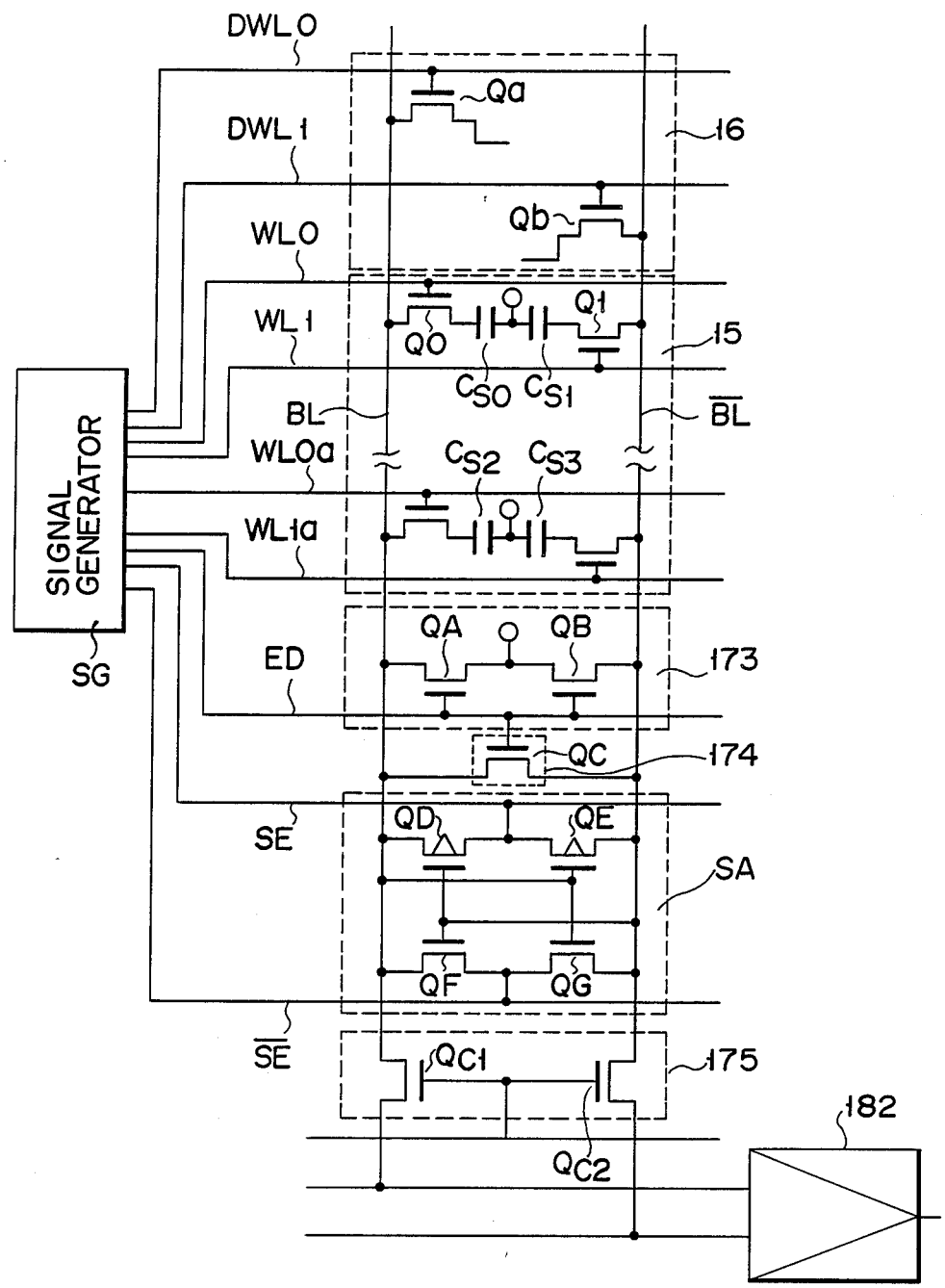
F I G. 11

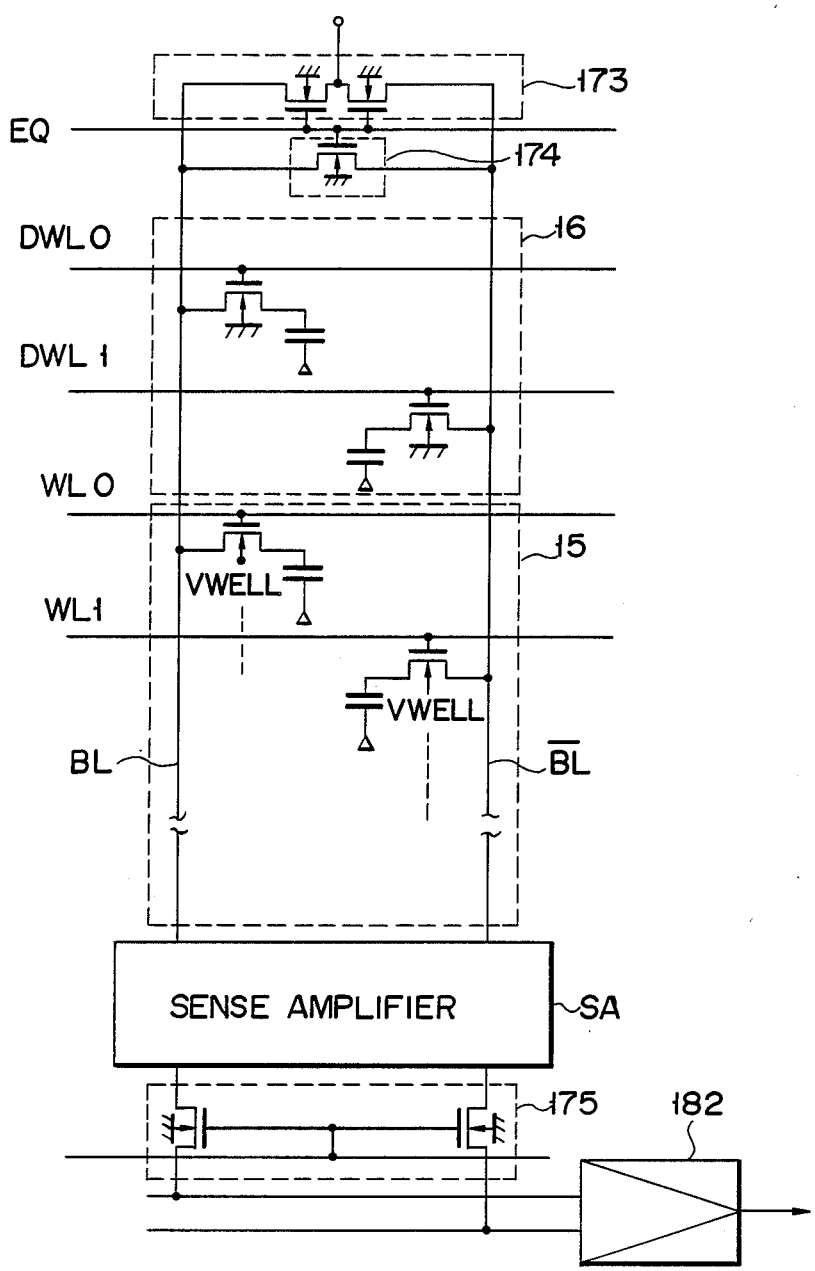
F I G. 12

COMPLEMENTARY SEMICONDUCTOR MEMORY DEVICE

BACKGROUND OF THE INVENTION

The present invention relates to a semiconductor memory device using a dynamic memory cell.

Conventionally, in a dynamic RAM having a CMOS structure, in order to prevent data destruction which occurs when minority carriers generated in external circuits, such as an address buffer or a data I/O buffer, are absorbed in a memory node (capacitor) of a memory cell, the memory cell is formed in a well region so as to be insulated from the external circuits.

FIG. 1 is a pattern plan view of a dynamic RAM having the above structure. P-type well regions 2 and 3 are formed in n-type semiconductor substrate 1. Memory cell array 4, dummy cell 5, and bit line driver 6 are formed in region 2. Driver 6 comprises a bit line precharger, a bit line equalizer, a sense amplifier, and a column selection switching circuit. External circuit 7 having a CMOS structure is formed in region 3 and substrate 1.

When array 4 is insulated from circuit 7 as described above, the memory cell is not adversely affected by minority carriers.

However, even if the above arrangement is adopted, data destruction sometimes still occurs. This is because a p-n junction between p-type region 2 and an n-type diffusion layer formed in region 2 is forwardly biased to generate minority carriers, due to coupling between a bit line, a word line, and control signal lines for driving driver 6, and region 2 in which array 4 is formed.

Another reason for the occurrence of data destruction is the generation of minority carriers upon operation of driver 6 formed together with array 4 in region 2. This is because a MOS transistor is often operated in a pentode region to generate a large number of minority carriers in driver 6 which comprises the bit line precharger, the bit line equalizer, the sense amplifier, and the column selection switching circuit.

Generation of minority carriers due to coupling between the signal lines and region 2 can be prevented by biasing region 2 below VSS, e.g., $-3$ V or less. However, well potential varies in accordance with an operation of driver 6. Therefore, if a well bias is applied, the power consumption of a biasing circuit greatly increases. In addition, since application of the well bias increases the threshold voltage of, for example, an n-channel MOS transistor in the sense amplifier, by way of a so-called substrate biasing effect, the current drive capacity of the sense amplifier is reduced, which leads to a reduction in the operating speed of the memory cell.

FIG. 2 shows a circuit arrangement in which the dynamic memory cell of FIG. 1 is applied to a dynamic memory cell of an intermediate potential precharging type.

In FIG. 2, reference symbols DWL0 and DWL1 denote dummy word lines; WL0, WL1, ..., WL0a, and WL1a, word lines; EQ, an equalizing control line; SE and $\overline{SE}$, sense amplifier control lines; BL and $\overline{BL}$, bit lines; Qa and Qb, n-channel MOS transistors constituting dummy cell 5; Cs0 to Cs3, data storing capacitors of memory cell array 4; Q0, Q1, Q0a, and Q1a, n-channel MOS transistors for a transfer gate of array 4; QA and QB, n-channel MOS transistors for bit line precharger 171; QC, an n-channel MOS transistor for bit line equalizer 172; QC1 and QC2, n-channel MOS transistors constituting column selection switching circuit 173; Bu, I/O buffer 181 constituting external circuit 7; QD and QE, p-channel MOS transistors constituting sense amplifier SA; and QF and QG, n-channel MOS transistors constituting amplifier SA.

As stated above, dummy cell 5 is constituted by a pair of transistors Qa and Qb. The source and drain of transistor Qa are commonly connected to line BL, those of transistor Qb are commonly connected to line $\overline{BL}$, and the gates of these transistors are connected to lines DWLa and DWLb, respectively.

Array 4 is constituted by a pair of transistors Q0 and Q1, a pair of transistors Q0a and Q1a, and capacitors Cs0 to Cs3. One of the source and drain of each of transistors Q0 and Q0a is connected to line BL, one of the source and drain of each of transistors Q1 and Q1a is connected to line $\overline{BL}$, and the gate of each transistor is connected to a corresponding one of lines WL0, WL1, WL0a, and WL1a. The other of the source and drain of each of transistors Q0, Q1, Q0a, and Q1a is connected to an end of a corresponding one of capacitors Cs0 to Cs3. The other ends of capacitors Cs0 to Cs3 are connected to a predetermined potential.

Conventionally, in order to drive such a dummy cell type dynamic memory cell, word lines WL and dummy word lines DWL are driven by signals of the same phase. This operation will now be described below, with reference to a timing chart shown in FIG. 3.

First, when line EQ is set at level "H", transistors QA and QB of precharger 171 and transistor QC of equalizer 172 are turned on. When transistors QA, QB, and QC are turned on, lines BL and $\overline{BL}$ are precharged to a potential of $\frac{1}{2}$ VDD. When precharging is completed, line EQ is set at level "L", and lines BL and $\overline{BL}$ are floated. Thereafter, one of the word lines, e.g., line WL0, is set at level "H", and transistor Q0 of a memory cell connected to line BL is turned on. When line BL is set at level "H", line DWLb is set at level "H", and transistor Qb of a dummy cell connected to line $\overline{BL}$ is turned on. When line WL0 is set at level "H" and transistor Q0 of the memory cell is turned on, potential difference $\Delta$Vsig corresponding to cell data is generated between lines BL and $\overline{BL}$. Therefore, when line SE is set at level "H" and line $\overline{SE}$ is set at level "L", amplifier SA is activated. As a result, difference $\Delta$Vsig is amplified by amplifier SA, to read out data.

On the other hand, when line WL1 is set at level "H", line DWLa is set at level "H", and data of the memory cell connected to line $\overline{BL}$ is read out.

As has been described above, in the case of the conventional memory cell, the dummy word line which is connected to the bit line opposite to that connected to the memory cell selected by the word line is activated. Signal waveforms of the word lines and the dummy word lines are as shown in FIG. 3. For example, the waveform of line WL0 is the same as that of line DWLa, as is the waveform of line WL1. Note that a voltage value obtained when the word line is selected is different from that obtained when the dummy word line is selected.

In the intermediate potential precharging type dynamic memory cell driven as described above, noise is generated in lines BL and $\overline{BL}$, in accordance with the capacitive coupling state between lines WL and DWL.

FIG. 4 is an equivalent circuit diagram showing various parasitic capacitances generated when the dynamic memory cell of FIG. 2 is driven in accordance with the timing chart of FIG. 3. Gate capacitance CG of the memory cell and wiring capacitance CW of wiring between bit and word lines BL and WL are connected between lines BL and WL. Wiring capacitance CDW of wiring between bit and dummy word lines BL and DWL is connected therebetween.

Wiring capacitance CW of wiring between lines $\overline{BL}$ and WL is connected therebetween. Gate capacitance CDG of the dummy cell and wiring capacitance CDW of wiring between lines $\overline{BL}$ and DWL are connected between lines $\overline{BL}$ and DWL.

Gate-substrate capacitance CB and word line-substrate capacitance CWL,B of the memory cell are connected between line WL and the substrate. Gate-substrate capacitance CDB and dummy word line-substrate capacitance CDWL,B are connected between line DWL and the substrate.

Since such parasitic capacitances exist, assuming that the amplitude of a signal applied to line WL is VWL (note that VWL>VDD where VDD is a power source potential) and the amplitude of a signal applied to line DWL is VDWL, potentials $\Delta$Vcoup1 and $\Delta$Vcoup2 of noise generated in lines BL and $\overline{BL}$ are represented by the following equations:

$$\Delta Vcoup1 = ((CG + CW) \cdot VWL + CDW \cdot VDWL)/CBL \quad (1)$$

$$\Delta Vcoup2 = (CW \cdot VEL + (CDG + CDW) \cdot VDWL)/CBL \quad (2)$$

where CBL is the parasitic capacitance respectively of lines BL and $\overline{BL}$.

The timing chart of FIG. 3 shows a case wherein noise potential $\Delta$Vcoup2 is generated in line $\overline{BL}$. The amplitudes of potentials $\Delta$Vcoup1 and $\Delta$Vcoup2 become about 100 mV at maximum, thereby degrading the sensitivity of the sense amplifier. As a result, such characteristics as the pause characteristic and the power source voltage margin are degraded.

As has been described above, in the case of the conventional device, since the potential of the word line to be selected and that of the dummy word line are varied in the same direction at the same time, a large amount of noise is generated in the bit lines and the substrate, thereby degrading such characteristics as the pause characteristic and the power source margin.

SUMMARY OF THE INVENTION

It is an object of the present invention to provide a semiconductor memory device possessing high operational reliability.

In a semiconductor memory device according to the present invention, only a memory cell array is formed in a specific well region of a conductivity type different from that of a semiconductor substrate, whereby the memory cell array is insulated from a bit line driver.

With this arrangement, the number of signal lines to be connected to the well region in which the memory cell array is formed can be reduced, and, in addition, the adverse influence of minority carriers generated upon operation of the bit line driver can be prevented. As a result, the operational reliability of the semiconductor memory device can be improved. Moreover, since a well bias can be applied only to the well region where the memory cell array is formed, an increase in power consumption or a reduction in the operation speed of a memory cell can be prevented.

In the semiconductor memory device according to the present invention, during the period in which memory cell array connected to a first bit line is selected, the potential of a word line to which a selected cell is connected is set at a first potential and, at the same time, the potential of a first dummy word line is changed to a second potential. After the period of selection of this memory cell array is completed, the word line potential is changed to the second potential, and, at the same time, the potential of the first dummy word line is changed to a third potential.

Then, during the period in which a memory cell array connected to a second bit line is selected, the potential of a word line to which a selected cell is connected is changed to the first potential and, at the same time, the potential of a second dummy word line is changed to the second potential. After the period of selection of this memory cell array is completed, the word line potential is changed to the second potential, and, at the same time, the potential of the second dummy word line is changed to the third potential.

As has been described above, the word line potential for driving the memory cell array connected to the first bit line and the potential of the second dummy word line or that for driving the memory cell array connected to the second bit line are changed in different directions.

Therefore, noise generated in the first bit line, on the basis of capacitive coupling between the word and bit lines, and that generated in the second bit line, on the basis of capacitive coupling between the dummy word and bit lines, cancel each other out, thereby reducing the noise generated in the first and second bit lines. Similarly, variations in the substrate potential are cancelled by the capacitive coupling between the word line and the substrate and that between the dummy word line and the substrate.

BRIEF DESCRIPTION OF THE DRAWINGS

FIG. 6 is a circuit diagram of the semiconductor memory device according to the present invention shown in the plan view of FIG. 5;

FIG. 11 is a circuit diagram of another embodiment of the semiconductor memory device according to the present invention;

FIG. 12 is a circuit diagram of still another embodiment of the semiconductor memory device according to the present invention.

DETAILED DESCRIPTION OF THE PREFERRED EMBODIMENTS

Figure 1:
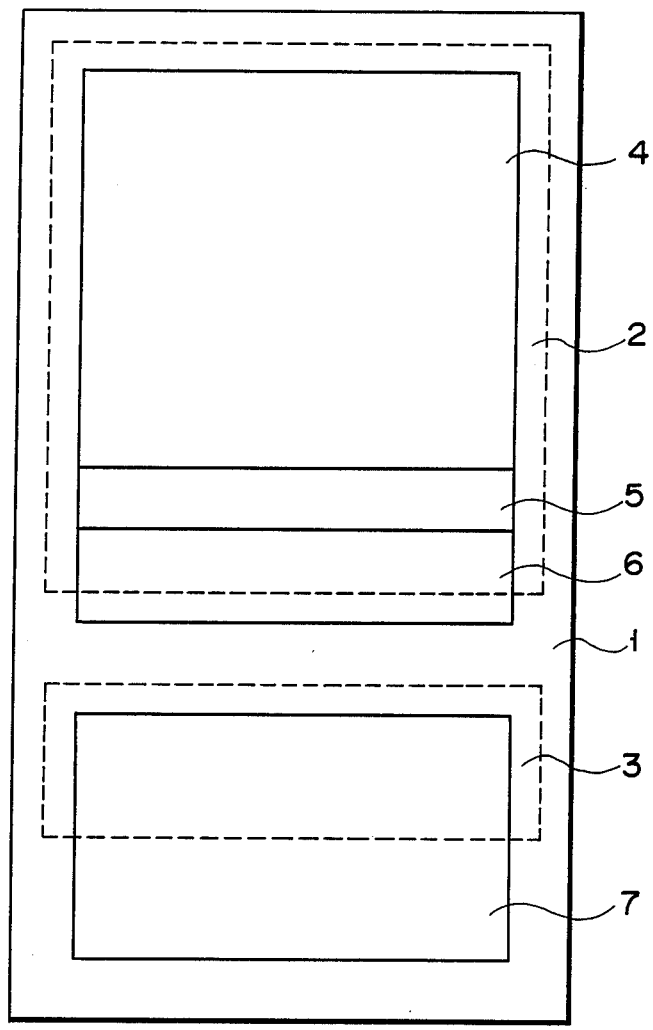
FIG. 1 is a pattern plan view of a conventional semiconductor memory device.
Figure 2:
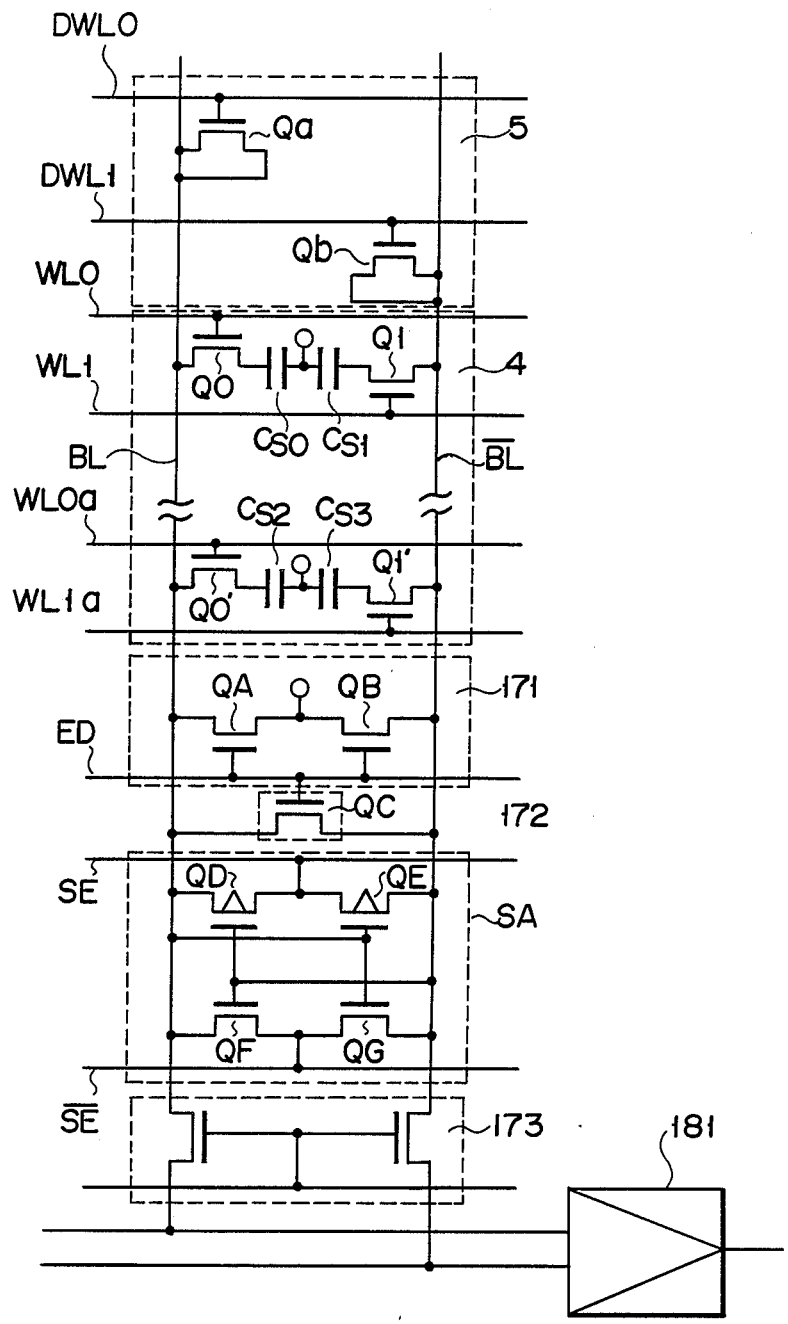
FIG. 2 is a circuit diagram of the conventional semiconductor memory device shown in the plan view of FIG. 1.
Figure 3:
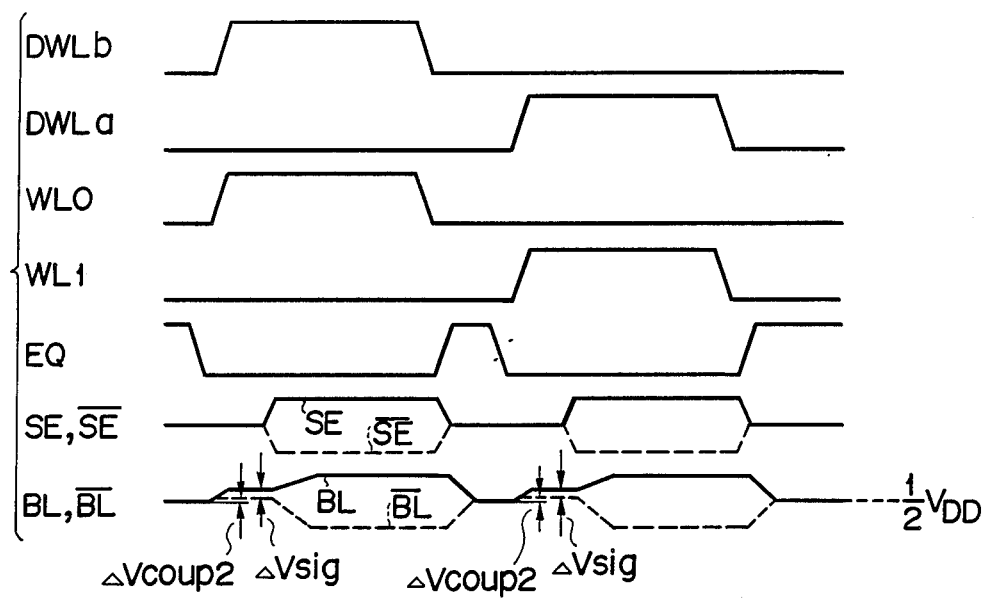
FIG. 3 is a timing chart for driving the circuit of the conventional semiconductor memory device shown in FIG. 2.
Figure 4:
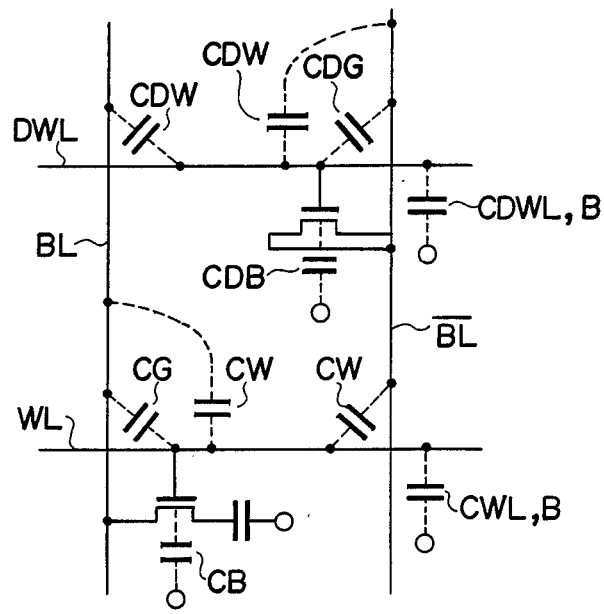
FIG. 4 is an equivalent circuit diagram of the conventional semiconductor memory device shown in FIG. 2.
Figure 5:
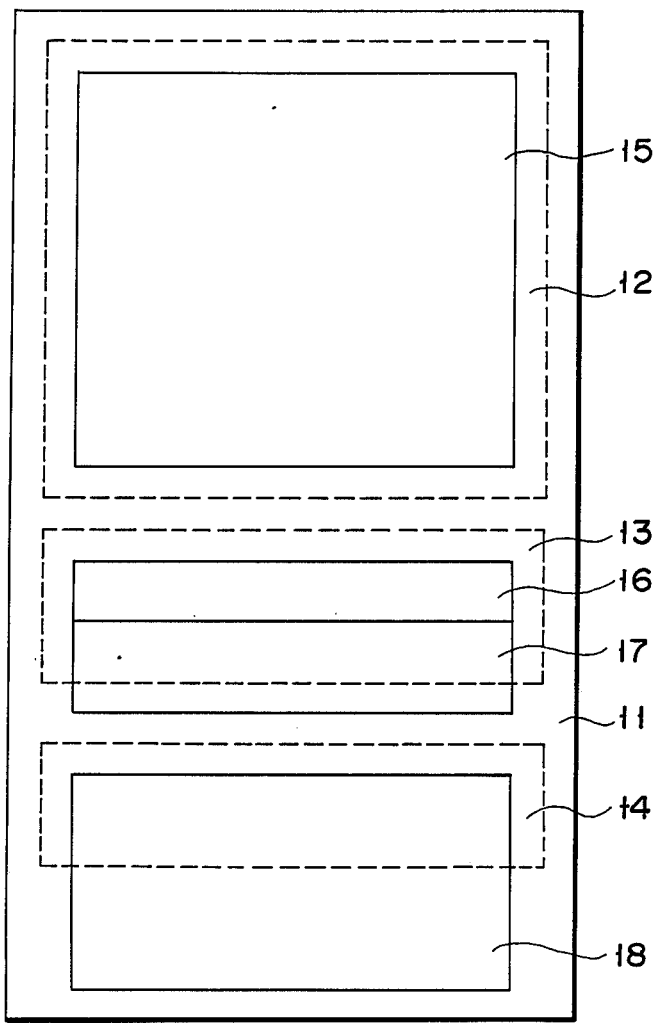
FIG. 5 is a pattern plan view of a semiconductor memory device according to the present invention in which a memory cell array is formed in a well region separated away from a dummy cell and a bit line driver.

The present invention will be described below with reference to the accompanying drawings. FIG. 5 is a pattern plan view of a semiconductor memory device according to the present invention. P-type well regions 12, 13, and 14 are formed in n-type semiconductor substrate 11. Only memory cell array 15 is formed in region 12. Dummy cell 16 and bit line driver 17 which are conventionally formed in the same well region where array 15 is formed are formed in region 13.

Driver 17 comprises a bit line precharger, a bit line equalizer, a sense amplifier, and a column selection switching circuit. Portions of these circuits which are constituted by p-channel MOS transistors are formed in substrate 11.

Similarly, external circuit 18 consisting of circuits other than driver 17 is formed in region 14 and substrate 11.

As described above, by insulating array 15 from driver 17, memory data destruction caused by minority carriers generated upon operation of driver 17 can be prevented. In addition, since only array 15 is formed in region 12, only bit and word lines are connected to region 12 as signal lines. Therefore, the number of minority carriers generated by coupling with the signal lines can be reduced.

FIG. 6 is a circuit diagram showing the semiconductor memory device including driver 17, cell 16, and array 15 in detail. Especially, FIG. 6 shows a case wherein the semiconductor memory device of the present invention is applied to an intermediate potential precharging type dynamic memory cell. In FIG. 6, reference symbols DWL0 and DWL1 denote dummy word lines; WL0, WL1, WL0a, and WL1a, word lines; EQ, an equalize signal line; SE and $\overline{SE}$, sense amplifier signal lines; BL and $\overline{BL}$, bit lines; Qa and Qb, n-channel MOS transistors constituting dummy cell 16; Cs0 to Cs3, data storing capacitors constituting array 15; Q0, Q1, Q0a, and Q1a, n-channel MOS transistors for a transfer gate constituting array 15; QA and QB, n-channel MOS transistors of bit line precharger 173; QC, an n-channel MOS transistor of bit line equalizer 174; QD and QE, p-channel MOS transistors constituting sense amplifier SA0; QF and QG, n-channel MOS transistors constituting amplifier SA0; QC1 and QC2, n-channel MOS transistors constituting column selection switching circuit 175; and 182, an I/O buffer.

Figure 7:
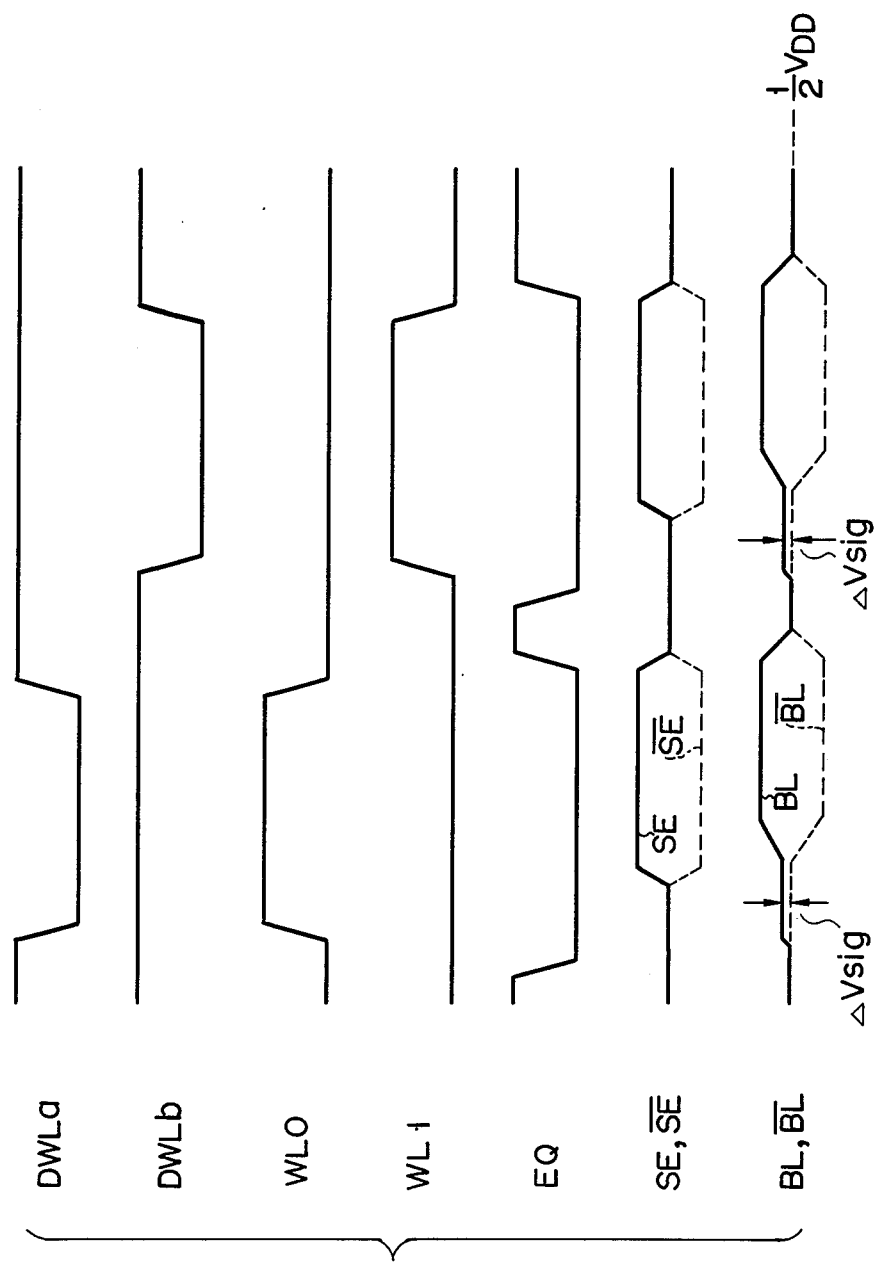
FIG. 7 is a timing chart for driving the semiconductor memory device according to the present invention shown in FIG. 6.

Reference symbol SG denotes a signal generator for outputting a signal to the circuit arrangement of the semiconductor memory device shown in FIG. 6 on the basis of a timing chart of FIG. 7.

Dummy cell 16 comprises a pair of transistors Qa and Qb. The source and drain of transistor Qa are connected to line BL, and the gate thereof is connected to line DWL0. The source and drain of transistor Qb are connected to line $\overline{BL}$, and the gate thereof is connected to line DWL1.

Array 15 comprises pairs of transistors Q0 and Q1, and Q0a and Q1a, and capacitors Cs0 to Cs3.

An operation of the semiconductor memory device having the above arrangement according to the present invention obtained when the device is driven by the timing chart of FIG. 7 will be described below. Note that in the following description, all the signals are output from generator SG. When line EQ is set at level "H", transistors QA, QB, and QC are turned on. When transistors QA, QB, and QC are turned on, lines BL and $\overline{BL}$ are precharged to a potential of $\frac{1}{2}$ VDD. When precharging is completed, line EQ is set at level "L", and lines BL and $\overline{BL}$ are floated. When precharging is completed, one of word lines, e.g., line WL0 is set at level "H", and transistor Q0 of a memory cell connected to line BL is turned on. When line WL0 is set at level "H", line DWL0 is set at level "L" in synchronism therewith. Transistor Qa of a dummy cell connected to line BL is turned off. At this time, line DWL1 is set at level "H", and transistor Qb of a dummy cell connected to line $\overline{BL}$ is kept on. When line WL0 is set at level "H" and transistor Q0 of the memory cell is turned on, potential difference $\Delta$Vsig corresponding to cell data is generated between lines BL and $\overline{BL}$.

Thereafter, when line SE is set at level "H" and line $\overline{SE}$ is set at level "L", amplifier SA is activated. When amplifier SA is activated, difference $\Delta$Vsig is amplified by amplifier SA, and data is read out. After data is read out, line WL0 is set at level "L", and at the same time, line DWL0 is set at level "H".

On the other hand, when line WL1 is set at level "H", line DWL1 is set at level "L" in synchronism therewith. At this time, line DWLa is set at level "H", and transistor Qa of the dummy cell connected to line BL is kept on. Therefore, when line WL1 is set at level "H" and transistor Q1 of the memory cell is turned on, difference $\Delta$Vsig corresponding to cell data is generated between lines BL and $\overline{BL}$. Thereafter, as described above, amplifier SA is activated, and difference $\Delta$Vsig is amplified, thereby reading out data. After the data is read out, line WL1 is set at level "L", and at the same time, line DWL1 is set at level "H".

Thus, in the semiconductor memory device according to the present invention, the memory cell is selected on the basis of the word line, and when the memory cell is activated, the dummy word line connected to the bit line to which the selected memory cell is connected is deactivated in synchronism therewith. In this case, signal waveforms of the word line of the memory cell and the dummy word line of the dummy cell connected to the same bit line have phases opposite to each other, as shown in FIG. 7. That is, the signal waveform of line WL0 has a phase opposite to that of the signal waveform of line DWL0, and the signal waveform of line WL1 has a phase opposite to that of the signal waveform of line DWL1.

Figure 8:
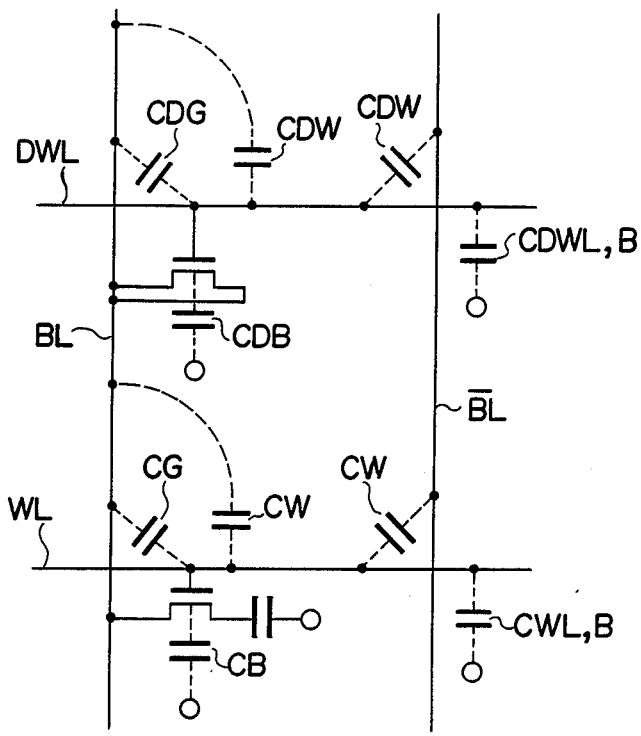
FIG. 8 is an equivalent circuit diagram obtained when the circuit of the semiconductor memory device according to the present invention of FIG. 6 is driven in accordance with the timing chart of FIG. 7.

FIG. 8 is an equivalent circuit diagram showing various parasitic capacitances generated when the dynamic memory cell shown in FIG. 6 is operated in accordance with the timing chart of FIG. 7.

Gate capacitance CG of the memory cell and wiring capacitance CW of wiring between lines BL and WL are connected between lines BL and WL. Gate capacitance CDG of the dummy cell and wiring capacitance CDW of wiring between lines BL and DWL are connected between lines BL and DWL.

Wiring capacitance CW of wiring between lines $\overline{BL}$ and WL is connected therebetween. Wiring capacitance CDW of wiring between lines $\overline{BL}$ and DWL is connected therebetween.

Capacitance CB between the gate of the memory cell and the substrate and capacitance BWL,B between line WL and the substrate are connected between line WL and the substrate. Capacitance CDB between the gate of the dummy cell and the substrate and capacitance CDW,B between line DWL and the substrate are connected between line DWL and the substrate.

When the above parasitic capacitances exist, assuming that an amplitude of a signal applied to line WL is VWL (VWL>VDD) and an amplitude of a signal applied to line DWL is VDWL, potentials ΔVcoup11 and ΔVcoup12 of noise generated respectively in lines BL and $\overline{BL}$ are given by the following equations:

$$\Delta Vcoup11 = ((CG+CW)\cdot VWL - (CDG+CDW)\cdot VDWL)/CBL \qquad (3)$$

$$\Delta Vcoup12 = (CW\cdot VWL - CDG\cdot VDWL)/CBL \qquad (4)$$

where CBL is a parasitic capacitance respectively of lines BL and $\overline{BL}$.

As is apparent from equations (3) and (4), each of noise potentials ΔVcoup11 and ΔVcoup12 generated in lines BL and $\overline{BL}$ is a difference between a noise component generated by capacitive coupling with the word line and a noise component generated by capacitive coupling with the dummy word line. For this reason, if gate capacitances CG and CDG, wiring capacitances CW and CDW, and capacitance CWL,B are equal to each other and amplitude VWL of the word line and amplitude VDWL of the dummy word line are set equal to each other, the noise component generated by the capacitive coupling with the word line and that generated by the capacitive coupling with the dummy word line cancel each other. That is, potentials ΔVcoup11 and ΔVcoup12 are not generated.

In an actual dynamic memory cell, a drive signal of line WL is obtained by boosting power source potential VDD. Therefore, VWL>VDWL, i.e., potentials Vcoup11 and Vcoup12 do not become zero.

However, as compared with a conventional device, the noise potential can be reduced enough. As a result, a reduction in sense sensitivity of the sense amplifier can be prevented, so that signal potential difference Vsig generated between lines BL and $\overline{BL}$ can be amplified with sufficient sensitivity. Therefore, characteristics such as a pause characteristic and a power source voltage margin can be improved.

Potential variations caused by capacitive coupling between line WL and the substrate and between line DWL and the substrate will be examined. As showing in the equivalent circuit diagram of FIG. 8, line WL is connected to the substrate through capacitances CB and CWL,B, and line DWL is connected to the substrate through capacitances CDB and CDWL,B.

Assuming that N memory cells and dummy cells are connected to lines WL and DWL, respectively, and a charge amount at the substrate side varying in accordance with operations of lines WL and DWL is ΔQwell, amount ΔQwell is given by the following equation;

$$\Delta Qwell = N(CB\cdot VWL - CDB\cdot VDWL) + CWL,B\cdot VWL - CDWL,B\cdot VDWL \qquad (5)$$

As is apparent from equation (5), in capacitive coupling with the substrate, a variation component of the charge amount generated by capacitive coupling with the word line and that of the charge amount generated by capacitive coupling with the dummy word line cancel each other.

In the conventional device, a variation component of the charge amount generated by the capacitive coupling with the word line and that of the charge amount generated by the capacitive coupling with the dummy word line superpose with each other, resulting in a large variation in a substrate potential. However, since the above variation can be reduced in this embodiment, the pause characteristic is significantly improved, and malfunction caused by variations in the substrate potential rarely occurs. This effect is significant in a dynamic memory cell having a structure wherein a memory cell and a dummy cell are formed in a well region having a conductivity type different from that of a substrate. That is, since a variation in a well region potential according to changes in a word line and a dummy word line can be prevented, a portion of the well region to which a potential is applied is limited to its peripheral portion or part thereof. Therefore, no problem is posed even if a degree of fixing the potential is small.

In the dynamic memory cell described above, since the drive current of line WL is obtained by boosting potential VDD, VWL>VDWL. For this reason, potentials ΔVcoup11 and ΔVcoup12 cannot be set to zero. Therefore, in order to set potentials ΔVcoup11 and ΔVcoup12 substantially at zero, sizes of transistors Q0 and Q1 constituting the memory cell and transistors Qa and Qb constituting the dummy cell may be set as follows.

Figures 9, 10:
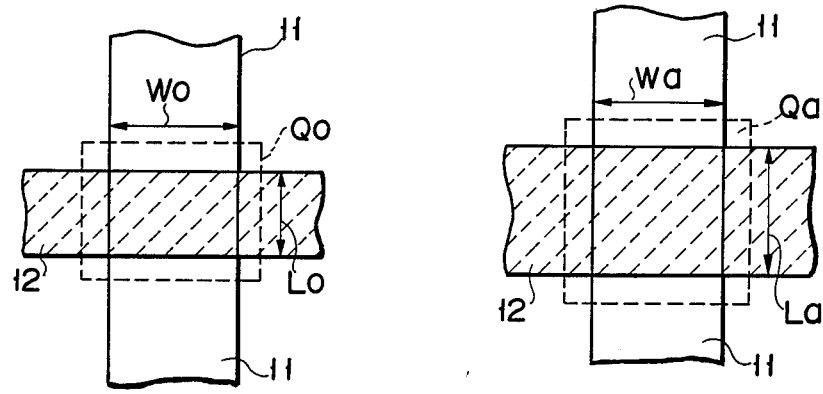
FIG. 9 is a pattern plan view of a MOS transistor constituting the memory cell array of the semiconductor memory device according to the present invention.
FIG. 10 is a pattern plan view of a MOS transistor constituting the dummy cell array of the semiconductor memory device according to the present invention.

That is, transistor Q0 constituting the memory cell is shown in the pattern plan view of FIG. 9, and transistor Qa constituting the dummy cell is shown in the pattern plan view of FIG. 10.

In FIGS. 9 and 10, reference numeral 11 denotes an activation region to serve as the source and drain of a MOS transistor; and 12, a gate electrode constituted by a polycrystalline silicon film or metal film such as an aluminum film to serve as the gate of the MOS transistor and line WL or DWL. In this case, assuming that a channel width of transistor Q0 is W0 and a channel length thereof is L0, and that a channel width of transistor Qa is Wa and a channel length thereof is La, a pattern size is so designed as to satisfy equations (6) and (7):

$$W0 = Wa \qquad (6)$$

$$La/L0 = (1/VDWL)/(1/VWL) = VWL/VDWL \qquad (7)$$

That is, since coupling capacitance is substantially proportional to an area, gate capacitance CDG of the dummy cell, wiring capacitance CDW of wiring between lines BL and DWL, capacitance CDB between the gate of the dummy cell and the substrate, and capacitance CDWL,B between line DWL and the substrate are given by the following equations (where constant F is a value of La/L0):

$$CDG = F\cdot DG \qquad (8)$$

$$CDW = F\cdot CW \qquad (9)$$

$$CDB = F \cdot CB \tag{10}$$

$$CDWL, B = F \cdot CWL, B \tag{11}$$

When the above equations are substituted in equations (3) and (4) representing potentials $\Delta V\text{coup}11$ and $\Delta V\text{coup}12$ generated in lines BL and $\overline{BL}$ and in equation (5) representing amount $\Delta Q\text{well}$ at the substrate side, $\Delta V\text{coup}11 = \Delta V\text{coup}12 = 0$ and $\Delta Q\text{well} = 0$ can be obtained.

That is, by satisfying equations (6) and (7), noise generated in lines BL and $\overline{BL}$ by coupling capacitance between the word and dummy word lines can be reduced to substantially zero. In addition, variations in the substrate potential can be reduced to substantially zero.

Although FIG. 6 shows an embodiment of the semiconductor memory device according to the present invention, the present invention is not limited to this embodiment.

FIG. 11 is another embodiment of a circuit arrangement of the semiconductor memory device according to the present invention. In FIG. 6, the source and drain of transistor Qa constituting dummy cell 16 are commonly connected to bit line BL, and those of transistor Qb constituting the same are commonly connected to bit line $\overline{BL}$, respectively. However, as shown in FIG. 11, one of the source and drain of each of transistors Qa and Qb may be floated. In this case, since gate capacitance CDG of cell 16 is divided by the bit line and a floating node, noise cannot be reduced to be zero even if the value (La/L0) of F is so set as to satisfy equation (5). However, by setting a larger value of F, noise can be reduced closer to zero.

FIG. 12 is a circuit arrangement obtained when well bias VWELL (<ground potential) is applied to p-type well region 12 of FIG. 5. Since only memory cell array 15 is formed in region 12, bias VWELL is applied to only region 12 but no other circuit portions. Therefore, an operation speed is not reduced due to power consumption or a substrate biasing effect as described above. As a result, minority carriers generated when a p-n junction formed between region 12 and an n-type diffusion layer in region 12 by coupling with the bit line or the word line can be prevented more effectively.

By applying bias VWELL, p-n junction capacitance between the n-type diffusion layer in contact with line BL or $\overline{BL}$ and region 12 is reduced. Therefore, parasitic capacitance added to the bit line can be reduced, and the operation speed can be increased.

Figure 13:
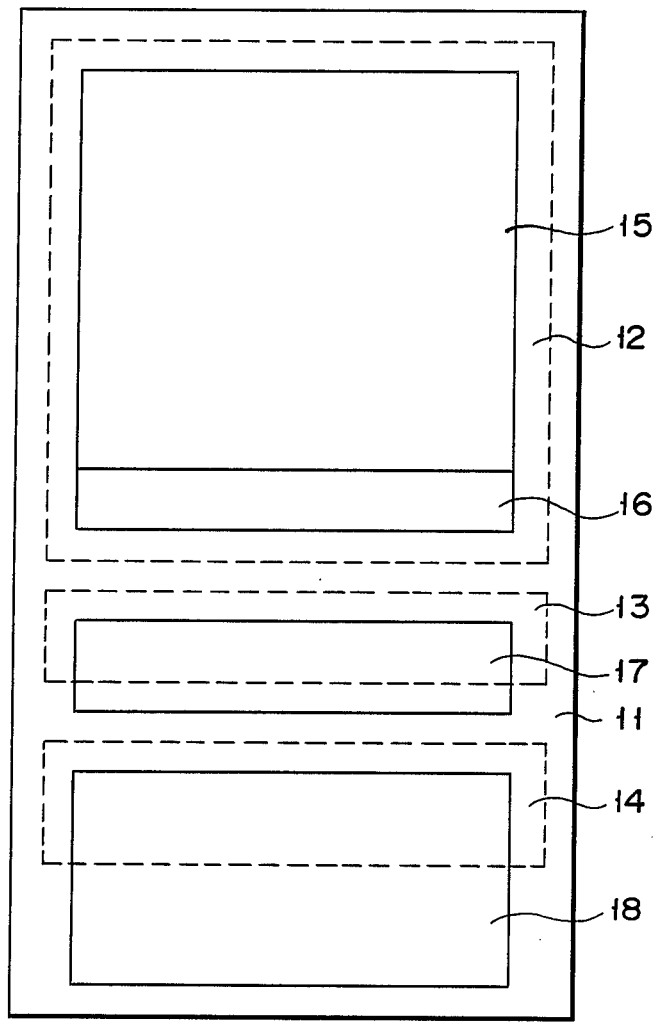
FIG. 13 is a plan view showing another pattern of the semiconductor memory device according to the present invention in which the memory cell array and the dummy cell are formed in the same well region.

FIG. 13 shows still another embodiment of the semiconductor memory device according to the present invention. In this embodiment, dummy cell 16 together with memory cell array 15 are formed in p-type well region 12. Other circuit portions are formed in other regions as in FIG. 5. That is, bit line driver 17 is formed in p-type well region 13 and substrate 11, and external circuit 18 is formed in p-type well region 14 and substrate 11.

Even if array 15 and dummy cell 16 are formed in the same region as described above, the number of minority carriers generated upon operation of dummy cell 16 and a substrate current are generally very small. Therefore, the same effect as that of FIG. 5 can be obtained. In FIGS. 5 and 13, driver 17 and circuit 18 are formed in different regions 13 and 14, respectively. However, driver 17 and circuit 18 may be formed in the same well region.

In addition, the present invention can be applied to a semiconductor memory device in which an n-type well region is formed in a p-type semiconductor substrate and a p-channel MOS transistor is used as a data transfer transistor of a memory cell. In this case, a bias to be applied to the n-type well region is a positive potential.

Moreover, when a method of driving the circuit arrangement of the semiconductor memory device as shown in FIGS. 6, 11, and 12 in which potentials of the word line and the dummy word line are complementarily varied is adopted, i.e., a method in which dummy word line DWL0 goes from level "L" to level "H" when word line WL0 goes from level "H" to level "L" and transistor Q0 is turned on is adopted, a potential variation in n-type well region 12 caused by coupling between lines WL0 and WL1 and region 12 and that in region 12 caused by coupling between lines DWL0 and DWL1 and region 12 cancel each other. Therefore, a potential of region 12 becomes stable, and generation of minority carriers can be prevented more reliably.

Especially, when one of the source and drain of each of transistors Qa and Qb of dummy cell 16 is floated as shown in FIG. 11, a significant effect of the present invention can be achieved by applying the circuit arrangement shown in FIG. 11 to the device in which memory cell array 15 and dummy cell 16 are formed in well region 20 having a conductivity type different from that of the substrate as shown in the pattern plan view of FIG. 13.

What is claimed is:

1. A semiconductor memory device comprising:
    a semiconductor substrate of a first conductive type;
    a plurality of well regions of a second conductivity type, formed in said semiconductor substrate;
    a memory cell array formed in a given one of said plurality of well regions, said memory cell array including a plurality of memory cells each having a MOS transistor for a transfer gate, one of the source and drain of which is connected to a first or second bit line, and the gate of which is connected to one of a plurality of word lines, and a data storing capacitor,
    a bit line driver and a dummy cell formed in one of said plurality of well regions, different from said well region in which said memory cell array is formed, said dummy cell including a first dummy cell having a first MOS transistor, at least one of the source and drain of which is connected to said first bit line, and the gate of which is connected to a first dummy word line, and a second dummy cell including a second MOS transistor, at least one of the source and drain of which is connected to said second bit line, and the gate of which is connected to a second dummy word line,
    during a period in which said memory cell of said memory cell array connected to said first bit line is selected, a potential of a work line connected to said memory cell is changed to a first potential, a potential of said first dummy line is changed to a second potential, in synchronism with a change in potential of said word line, a potential of said word line is changed to the second potential after the selection period of said memory cell is completed, and a potential of said dummy word line is changed to a third potential, in synchronism with a change in potential of said word line, and
    during a period in which said memory cell of said memory cell array connected to said second bit line is selected, a potential of a word line connected to said memory cell is changed to the first potential, a potential of said second dummy word line is changed to the second potential, in synchronism with a change in potential of said word line, a potential of said word line is changed to the second potential after the selection period of said memory cell is completed, and a potential of said second dummy word line is changed to the third potential, in synchronism with a change in potential of said word line.

2. A device according to claim 1, wherein a well bias is applied to said well region in which said memory cell array is formed.

3. A device according to claim 1, wherein
said bit line driver comprises a bit line precharger, a bit line equalizer, a sense amplifier, and a column selection switching circuit.

4. A device according to claim 1, wherein
both the source and drain of said first MOS transistor of said dummy cell are connected to said first bit line, and both the source and drain of said second MOS transistor of said dummy cell are connected to said second bit line.

5. A device according to claim 1, wherein
a ratio between a gate length of said first and second MOS transistors of said dummy cell and a gate length of said transfer gate MOS transistor of said memory cell of said memory cell array is set to be a value of or greater than the ratio of an amplitude of a voltage of said word line to an amplitude of a voltage of said first and second dummy word lines.

6. A semiconductor memory device comprising:
a semiconductor substrate of a first conductivity type;
a plurality of well regions of a second conductivity type, formed in said semiconductor substrate;
a memory cell array and a dummy cell formed in a given one of said plurality of well regions, said memory cell array including a plurality of memory cells each having a MOS transistor for a transfer gate, one of the source and drain of which is connected to a first or second bit line, and the gate of which is connected to one of a plurality of word lines, and a data storing capacitor,
said dummy cell including a first dummy cell comprising a first MOS transistor, at least one of the source and drain of which is connected to said first bit line, and the gate of which is connected to a first dummy word line, and a second dummy cell including a second MOS transistor, at least one of the source and drain of which is connected to said second bit line, and the gate of which is connected to a second dummy word line; and
a bit line driver formed in one of said plurality of well regions, different from said well region in which said memory cell array is formed;
during a period in which said memory cell of said memory cell array connected to said first bit line is selected, a potential of a word line connected to said memory cell is changed to a first potential, a potential of said first dummy line is changed to a second potential in synchronism with a change in potential of said word line, a potential of said word line is changed to the second potential after the selection period of said memory cell is completed, and a potential of said dummy word line is changed to a third potential, in synchronism with a change in potential of said word line, and
during a period in which said memory cell of said memory cell array connected to said second bit line is selected, a potential of a word line connected to said memory cell is changed to the first potential, a potential of said second dummy word line is changed to the second potential, in synchronism with a change in potential of said word line, a potential of said word line is changed to the second potential after the selection period of said memory cell is completed, and a potential of said second dummy word line is changed to the third potential, in synchronism with a change in potential of said word line.

7. A device according to claim 6, wherein
a well bias is applied to said well region in which said memory cell array is formed.

8. A device according to claim 6, wherein
said bit line river comprises a bit line precharger, a bit line equalizer, a sense amplifier, and a column selection switching circuit.

9. A device according to claim 6, wherein
both the source and drain of said first MOS transistor of said dummy cell are connected to said first bit line, and both the source and drain of said second MOS transistor of said dummy cell are connected to said second bit line.

10. A device according to claim 6, wherein
a ratio between a gate length of said first and second MOS transistors of said dummy cell and a gate length of said transfer gate MOS transistor of said memory cell of said memory cell array is set to be a value of or greater than the ratio of an amplitude of a voltage of said word line to an amplitude of a voltage of said first and second dummy word lines.

* * * * *